(12) United States Patent
Nawa et al.

(10) Patent No.: US 7,875,407 B2
(45) Date of Patent: Jan. 25, 2011

(54) COLORED ALKALI-DEVELOPABLE PHOTOSENSITIVE RESIN COMPOSITION AND COLOR FILTER USING THE SAME

(75) Inventors: Nozomi Nawa, Tokyo (JP); Yasuyuki Demachi, Tokyo (JP); Azumi Sato, Tokyo (JP); Hiromitsu Ito, Tokyo (JP); Yoshie Makabe, Tokyo (JP); Naomi Sato, Tokyo (JP); Naoki Maeda, Tokyo (JP); Kazuyuki Fuchigami, Tokyo (JP)

(73) Assignees: Toppan Printing Co., Ltd., Tokyo (JP); Adeka Corporation, Tokyo (JP)

( * ) Notice: Subject to any disclaimer, the term of this patent is extended or adjusted under 35 U.S.C. 154(b) by 568 days.

(21) Appl. No.: 11/814,047

(22) PCT Filed: Jun. 5, 2006

(86) PCT No.: PCT/JP2006/311193
§ 371 (c)(1),
(2), (4) Date: Jul. 16, 2007

(87) PCT Pub. No.: WO2006/137257
PCT Pub. Date: Dec. 28, 2006

(65) Prior Publication Data
US 2009/0202750 A1 Aug. 13, 2009

(30) Foreign Application Priority Data
Jun. 20, 2005 (JP) .............................. 2005-178853

(51) Int. Cl.
G02B 5/20 (2006.01)
G03F 1/72 (2006.01)

(52) U.S. Cl. ........................................ 430/7; 430/286.1

(58) Field of Classification Search ........................ None
See application file for complete search history.

(56) References Cited

U.S. PATENT DOCUMENTS

2003/0082355 A1* 5/2003 Iwaida et al. ................. 428/209

FOREIGN PATENT DOCUMENTS

| JP | 5281734 | | 10/1993 |
| JP | 3148429 | | 12/1993 |
| JP | 2000-053746 | * | 2/2000 |
| JP | 2003-89716 | | 3/2003 |
| JP | 2003107702 | | 4/2003 |
| JP | 2004138950 | | 5/2004 |
| JP | 2004263142 | | 9/2004 |
| JP | 2005-239817 | * | 9/2005 |
| JP | 200684985 | | 3/2006 |
| WO | 2005092826 | | 10/2005 |
| WO | 2006030630 | | 3/2006 |
| WO | 2006030631 | | 3/2006 |

OTHER PUBLICATIONS

Computer-generated translation of JP 2005-239817 (Sep. 2005).*
Computer-generated translation of JP 2000-053746 (Feb. 2000).*

* cited by examiner

Primary Examiner—John A. McPherson
(74) Attorney, Agent, or Firm—Young & Thompson

(57) ABSTRACT

A colored alkali-developable photosensitive resin composition comprising an alkali-developable resin composition that contains a reaction product obtained by esterification of an epoxy-adduct with a polybasic acid anhydride (C) and then with a polyfunctional epoxy compound (D), wherein the epoxy-adduct has a structure in which an unsaturated monobasic acid (B) is added to an epoxy resin (A) represented by general formula (I) below, a coloring material (E) and a photopolymerization initiator (F).

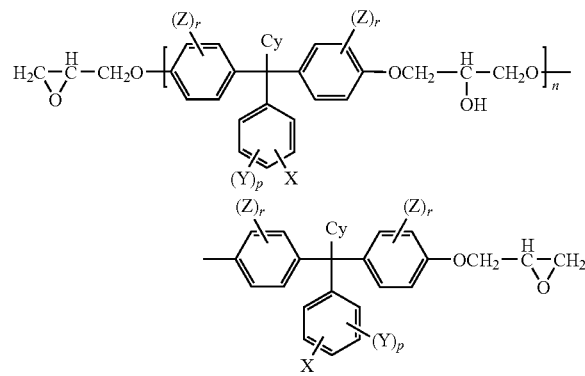

wherein Cy represents a cycloalkyl group having 3 to 10 carbon atoms; X represents a hydrogen atom, a phenyl group, or a cycloalkyl group having 3 to 10 carbon atoms; the phenyl group or the cycloalkyl group having 3 to 10 carbon atoms is optionally substituted with an alkyl group having 1 to 10 carbon atoms, an alkoxy group having 1 to 10 carbon atoms, or a halogen atom; each of Y and Z independently represents an alkyl group having 1 to 10 carbon atoms, an alkoxy group having 1 to 10 carbon atoms, an alkenyl group having 2 to 10 carbon atoms, or a halogen atom, wherein the alkyl group, the alkoxy group, and the alkenyl group are optionally substituted with a halogen atom; n represents a number of 0 to 10; p represents a number of 0 to 4; and r represents a number of 0 to 4.

10 Claims, No Drawings

COLORED ALKALI-DEVELOPABLE PHOTOSENSITIVE RESIN COMPOSITION AND COLOR FILTER USING THE SAME

TECHNICAL FIELD

The present invention relates to a colored alkali-developable photosensitive resin composition that is suitably used for producing color filters used in liquid crystal displays, plasma displays, electroluminescence panels, video cameras, and the like; and a color filter using the colored alkali-developable photosensitive resin composition.

BACKGROUND ART

A colored alkali-developable photosensitive resin composition is an alkali-developable resin composition containing a specific compound having an ethylenic unsaturated bond that further contains a coloring material such as a pigment, a dye, or the like and a photopolymerization initiator. Such a colored alkali-developable photosensitive resin composition is used for photocurable ink, photosensitive printing plates, printed wiring boards, various types of resists, and the like since the composition can be polymerized to cure by irradiating with ultraviolet ray or electron beam. Recently, it has been desired to form micro-patterns with high precision so as to follow minitualization and high functionalization of electronics.

With respect to alkali-developable resin compositions and alkali-developable photosensitive resin compositions, Patent Document 1 below proposes a photopolymerizable unsaturated compound and an alkali-developable photosensitive resin composition containing the compound. Patent Document 2 below proposes a resin composition containing a poly(carboxylic acid) resin and a photosensitive resin composition containing the resin composition. Patent Document 3 below proposes an alkali-soluble unsaturated resin and a radiation-sensitive resin composition containing the resin. However, the sensitivities of these publicly known alkali-developable photosensitive resin compositions are insufficient, and proper pattern shape and micro-patterns have been difficult to obtain with colored alkali-developable photosensitive resin compositions using these alkali-developable photosensitive resin compositions. Accordingly, there has been demand for a colored alkali-developable photosensitive resin composition that is excellent in transparency, adhesiveness, and alkali-resistance and capable of forming micro-patterns with high precision.

Patent Document 1: Japanese Patent No. 3148429
Patent Document 2: Japanese Patent Laid-open Publication No. 2003-107702
Patent Document 3: Japanese Patent Laid-open Publication No. 2003-89716

DISCLOSURE OF THE INVENTION

Problems to be Solved by the Invention

The problem to be solved is, as described above, that there has been no colored alkali-developable photosensitive resin composition that has sufficient sensitivity with adhesiveness and alkali-resistance maintained and enables proper pattern shape and micro-patterns to be formed.

Accordingly, an object of the present invention is to provide a colored alkali-developable photosensitive resin composition that is excellent in sensitivity, resolution, adhesiveness, alkali-resistance, and the like and capable of forming micro-patterns with high precision; and a color filter using the colored alkali-developable photosensitive resin composition.

Means for Solving the Problems

According to the present invention, the above object is achieved by providing a colored alkali-developable photosensitive resin composition comprising an alkali-developable photosensitive resin composition that contains a reaction product obtained by esterification of an epoxy-adduct with a polybasic acid anhydride (C) and then with a polyfunctional epoxy compound (D), wherein the epoxy-adduct has a structure in which an unsaturated monobasic acid (B) is added to an epoxy resin (A) represented by general formula (I) below, a coloring material (E) and a photopolymerization initiator (F).

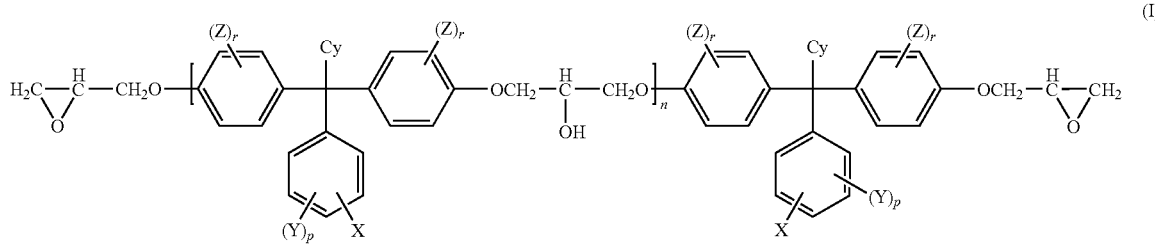

wherein Cy represents a cycloalkyl group having 3 to 10 carbon atoms; X represents a hydrogen atom, a phenyl group, or a cycloalkyl group having 3 to 10 carbon atoms; the phenyl group or the cycloalkyl group having 3 to 10 carbon atoms is optionally substituted with an alkyl group having 1 to 10 carbon atoms, an alkoxy group having 1 to 10 carbon atoms, or a halogen atom; each of Y and Z independently represents an alkyl group having 1 to 10 carbon atoms, an alkoxy group having 1 to 10 carbon atoms, an alkenyl group having 2 to 10 carbon atoms, or a halogen atom, wherein the alkyl group, the alkoxy group, and the alkenyl group are optionally substituted with a halogen atom; n represents a number of 0 to 10; p represents a number of 0 to 4; and r represents a number of 0 to 4.

Further, according to another aspect of the present invention, the above object is achieved by providing a color filter comprising at least a light-transmitting base material and a color filter layer composed of a pixel pattern with a plurality of colors, wherein at least one color in the pixel pattern with the plurality of colors is a cured article of the above-described colored alkali-developable photosensitive resin composition.

In addition, according to still another aspect of the present invention, the above object is achieved by providing a color filter comprising at least a light-transmitting base material and a color filter layer composed of a pixel pattern with a plurality of colors and a black matrix, wherein the black matrix is a cured article of the above-described colored alkali-developable photosensitive resin composition.

BEST MODE FOR CARRYING OUT THE INVENTION

In the following, the colored alkali-developable photosensitive resin composition of the present invention will be described in detail with reference to preferred embodiments.

The colored alkali-developable photosensitive resin composition of the present invention comprises a reaction product obtained by esterification of an epoxy adduct with a polybasic acid anhydride (C) and then with a polyfunctional epoxy compound (D), wherein the epoxy product has a structure in which an unsaturated monobasic acid (B) is added to an epoxy resin (A) represented by general formula (I) above, a coloring material (E) and a photopolymerization initiator (F).

The epoxy adduct preferably has a structure in which the unsaturated monobasic acid (B) is added to the epoxy resin (A) represented by general formula (I) above in such a ratio that the number of carboxyl group in the unsaturated monobasic acid (B) per epoxy group in the epoxy resin (A) is 0.1 to 1.0, particularly 0.4 to 1.0.

The polybasic acid anhydride (C) preferably is esterified with the epoxy adduct in such a ratio that the number of the acid anhydride moiety in the polybasic acid anhydride (C) per hydroxyl group in the epoxy adduct is 0.1 to 1.0, particularly 0.4 to 1.0, and the polyfunctional epoxy compound (D) preferably forms ester bonds in such a ratio that the number of the epoxy group in the polyfunctional epoxy compound (D) per hydroxyl group in the epoxy adduct is 0.1 to 1.0, particularly 0.4 to 1.0.

In general formula (I) above, the cycloalkyl group having 3 to 10 carbon atoms represented by Cy includes cyclopropyl, cyclobutyl, cyclopentyl, cyclohexyl, methylcyclohexyl, cycloheptyl, cyclooctyl, cyclononyl, cyclodecyl, and the like.

The cycloalkyl group having 3 to 10 carbon atoms represented by X includes, for example, the groups given as examples of the cycloalkyl group having 3 to 10 carbon atoms represented by Cy. As the alkyl group having 1 to 10 carbon atoms, the alkoxy group having 1 to 10 carbon atoms, and the halogen atom that may serve as a substituent of the phenyl group or the cycloalkyl group having 3 to 10 carbon atoms represented by X, there may be mentioned each of the groups or atoms described below as examples of those represented by Y or Z.

The alkyl group having 1 to 10 carbon atoms represented by Y or Z includes methyl, ethyl, propyl, isopropyl, butyl, isobutyl, sec-butyl, tert-butyl, amyl, isoamyl, tert-amyl, hexyl, heptyl, octyl, isooctyl, tert-octyl, 2-ethylhexyl, nonyl, isononyl, decyl, isodecyl, and the like. The alkoxy group having 1 to 10 carbon atoms represented by Y or Z includes methoxy, ethoxy, propyloxy, butyloxy, sec-butoxy, tert-butoxy, pentoxy, hexyloxy, heptoxy, octyloxy, 2-ethylhexyloxy, and the like. The alkenyl group having 2 to 10 carbon atoms represented by Y or Z includes vinyl, allyl, butenyl, propenyl, and the like. The halogen atom represented by Y or Z includes fluorine, chlorine, bromine, and iodine.

The alkyl group and the alkoxy group that may serve as a substituent of the phenyl group or the cycloalkyl group having 3 to 10 carbon atoms represented by X; and the alkyl group, the alkoxy group and the alkenyl group represented by Y or Z are optionally substituted with a halogen atom. Here, the halogen atom includes fluorine, chlorine, bromine, and iodine. For example, as the alkyl group having 1 to 10 carbon atoms substituted with fluorine atom(s), there may be mentioned monofluoromethyl, difluoromethyl, trifluoromethyl, trifluoroethyl, perfluoroethyl, and the like.

The colored alkali-developable photosensitive resin composition of the present invention provides a cured article excellent in adhesion to a base material, alkali-resistance, workability, strength, and the like since the epoxy resin (A) used for preparing the composition has a triarylmonocycloalkylmethane skeleton. Therefore, by using this resin composition, it is considered that a clear image can be formed with high precision when uncured parts are removed in developing even in the case of a micro-pattern. The epoxy resin (A) is preferably, in general formula (I) above, a resin wherein Cy is a cyclohexyl group, a resin wherein X is a phenyl group, a resin wherein p and r are 0, or a resin wherein n is 0 to 5, particularly 0 to 1.

Specific examples of the epoxy resin (A) represented by general formula (I) above include compounds No. 1 to No. 9 below. The present invention, however, is not limited by these compounds.

Compound No. 1

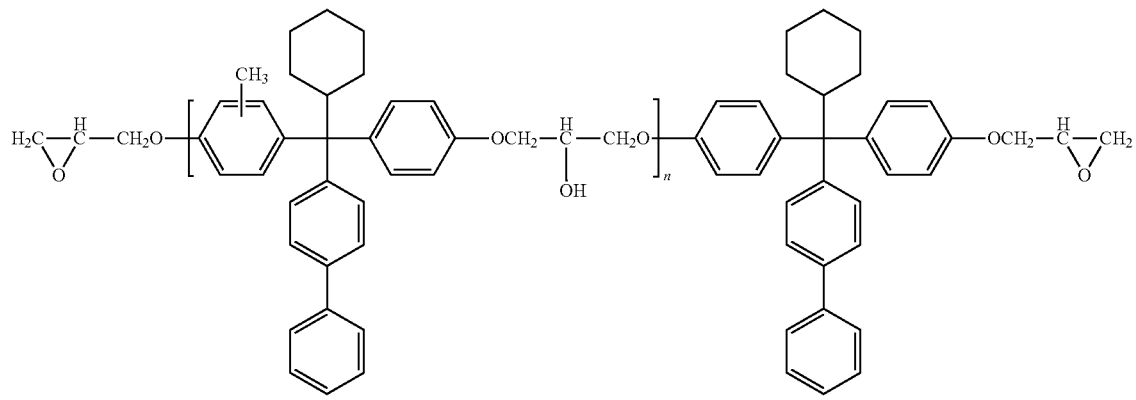

-continued
Compound No. 2
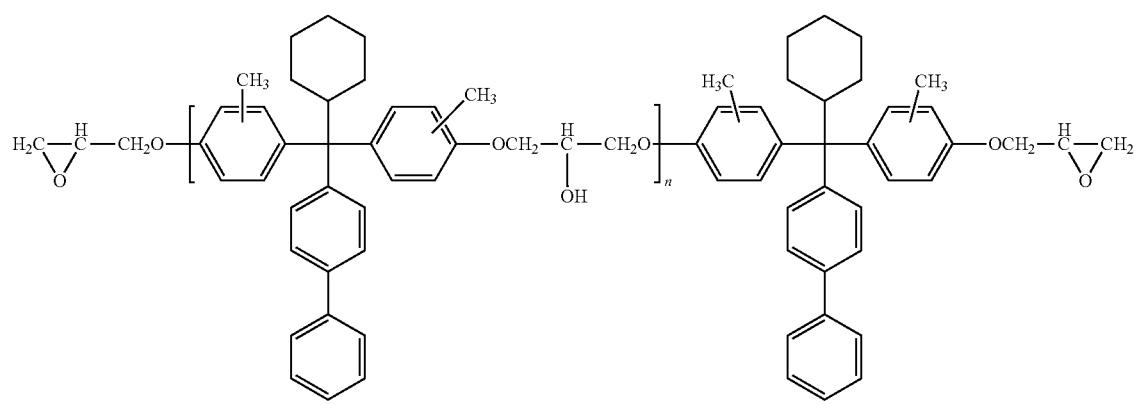
Compound No. 3
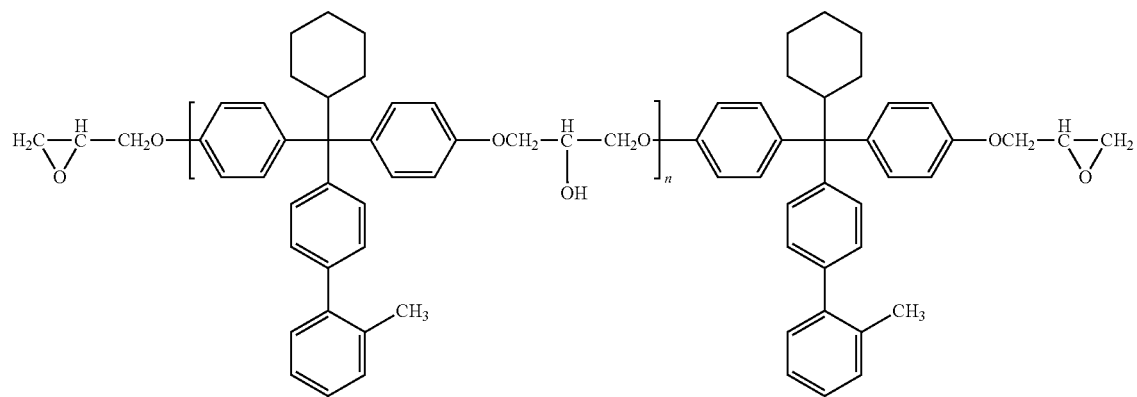
Compound No. 4
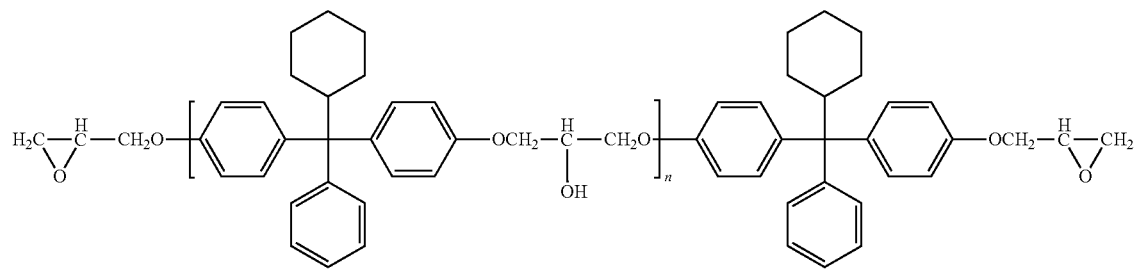
Compound No. 5
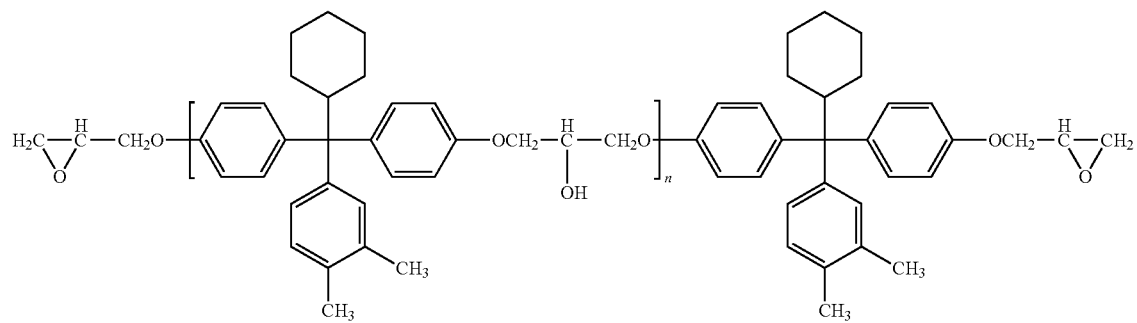

-continued
Compound No. 6
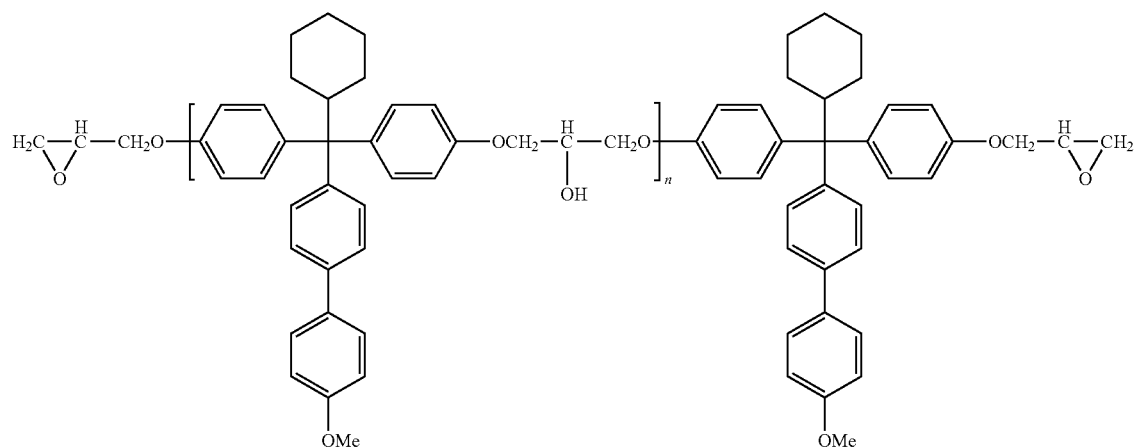
Compound No. 7
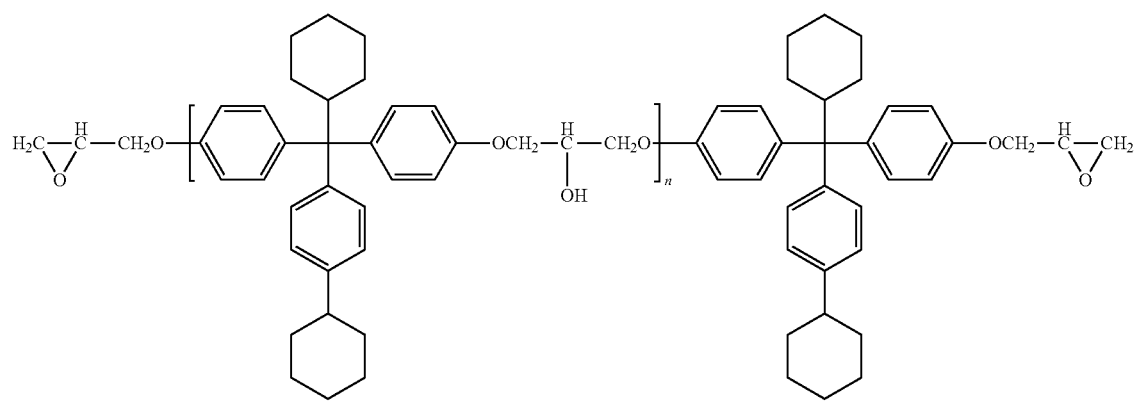
Compound No. 8
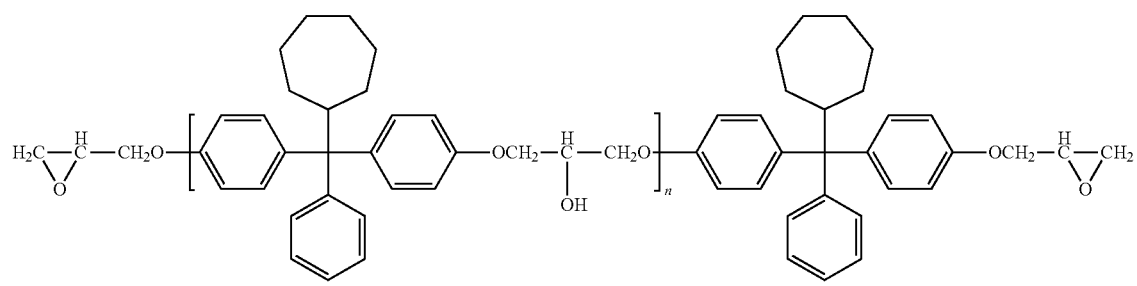

-continued

Compound No. 9

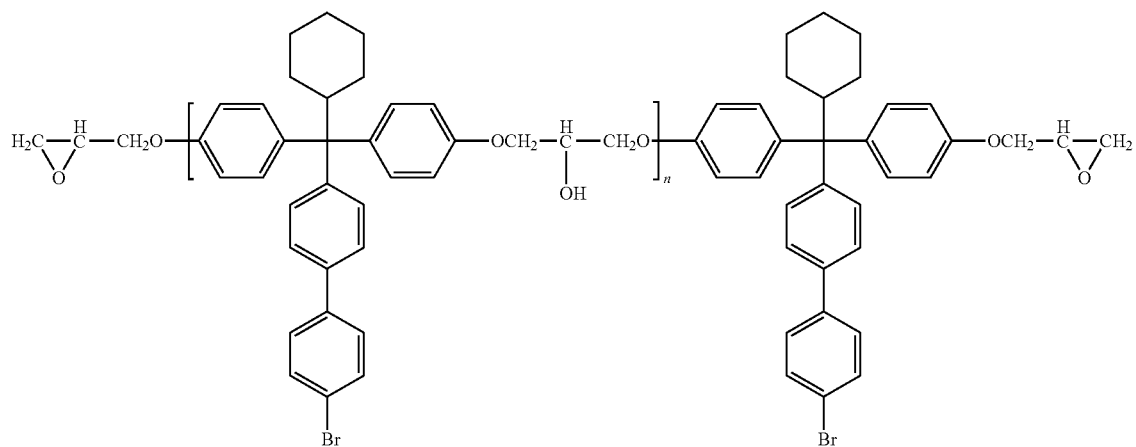

One can produce the reaction product contained in the alkali-developable resin composition, wherein the reaction product is obtained by esterification of the epoxy adduct having a structure in which the component (B) is added to the component (A) with the component (C) and then with the component (D), for example, by a method represented by reaction formula below.

First, the component (B), unsaturated monobasic acid (2), is added to the component (A), epoxy resin (1), to obtain a resin composition containing an epoxy adduct, compound (3). The addition reaction of the component (B) to the component (A) can be performed according to a usual method.

Next, the epoxy adduct, compound (3), is esterified by treating with the component (C), polybasic acid anhydride (4), to yield a resin composition containing an ester compound, compound (5). The esterification of the epoxy adduct with the component (C) can be performed according to a usual method. Subsequently, the ester compound, compound (5) is treated with the polyfunctional epoxy compound (D), diepoxy compound (6), to yield a resin composition containing the desired reaction product, compound (7). The esterification of the above ester compound with the component (D) can be performed according to a usual method.

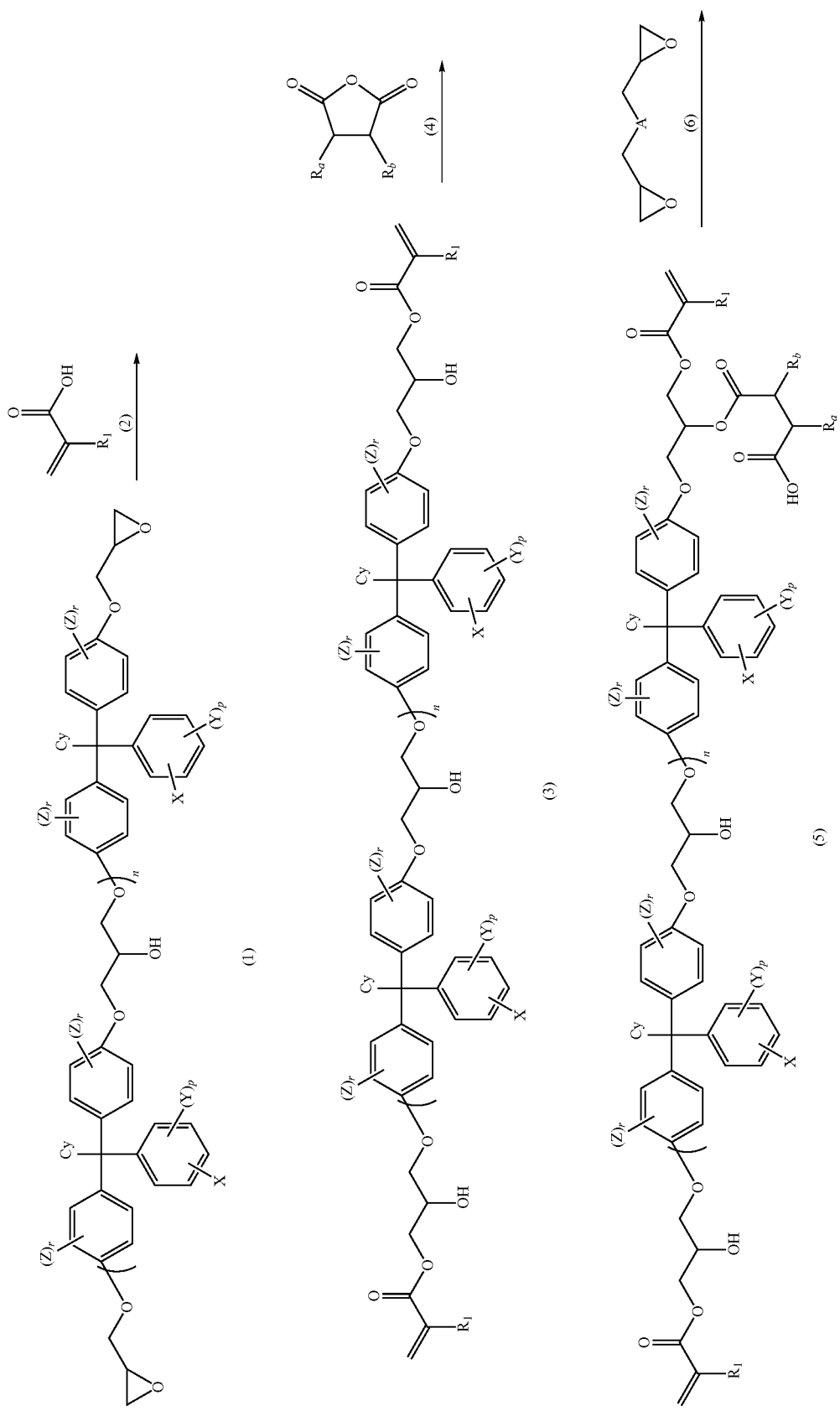

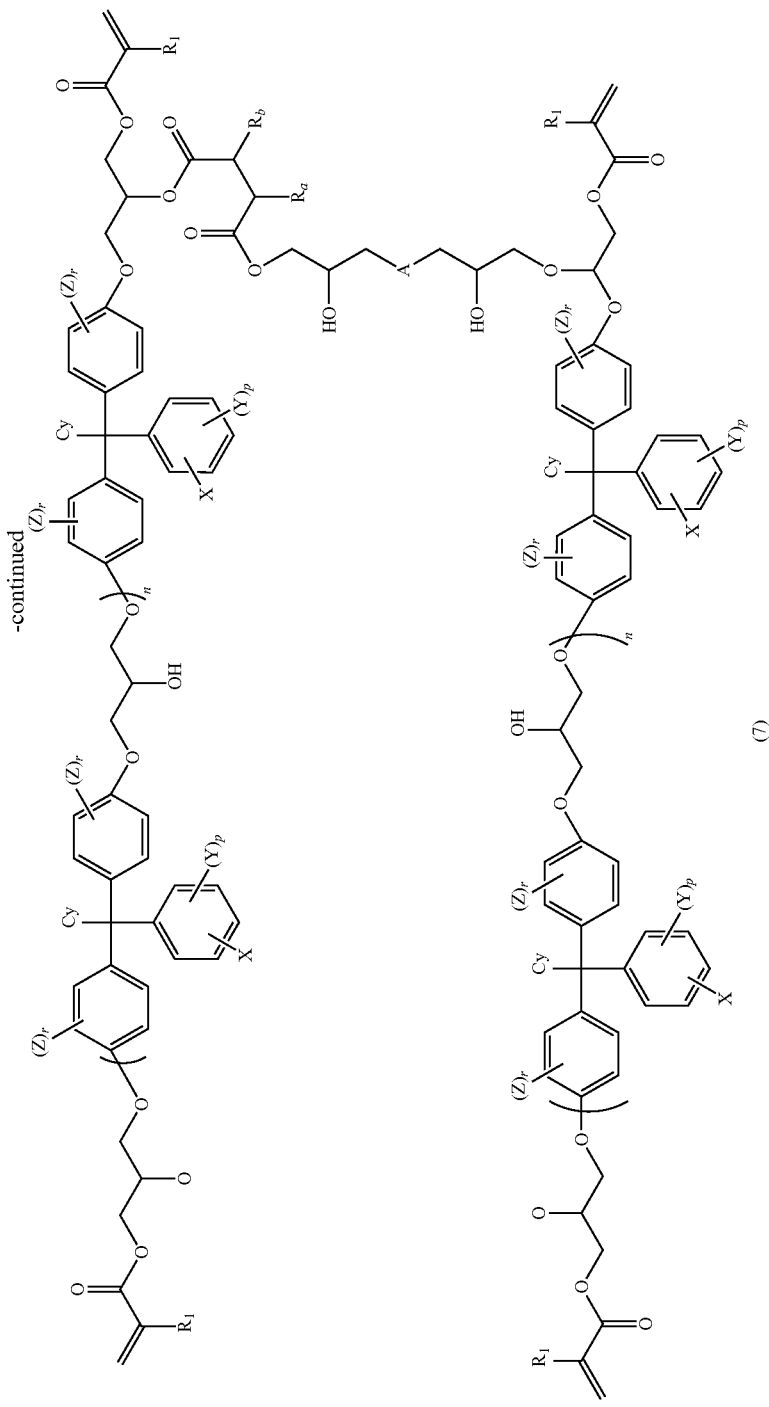

As seen from the structure of compound (7) in reaction formula above, the esterification of the ester compound, which was obtained by esterification of the epoxy compound with the component (C), with the component (D) is brought about between the carboxyl group originating from the component (C) in the ester compound and the epoxy group in the component (D), the polyfunctional epoxy compound. In order to assure that reaction proceeds between the carboxyl group originating from the component (C) and the epoxy group in the component (D), the polyfunctional epoxy compound, it is preferred to use the component (C) and the component (D) in amounts selected from such ranges in which the sum of the number of the acid anhydride moiety in the polybasic acid anhydride per hydroxyl group in the epoxy adduct and the number of the epoxy group in the polyfunctional epoxy compound (D) per hydroxyl group in the epoxy adduct is larger than 1.0, particularly 1.1 to 2.0.

The method for obtaining compound (3), the epoxy adduct, shown in reaction formula above is not limited to the above method. For example, when n in compound (3) is 0, compound (3) can be also obtained by reaction of bisphenol (8) with monoepoxy compound containing a glycidyl methacrylate (9), as shown in reaction formula below.

The unsaturated monobasic acid (B) used in preparing the alkali-developable resin composition is used for improving the sensitivity of the alkali-developable resin composition. It includes, for example, acrylic acid, methacrylic acid, crotonic acid, cinnamic acid, sorbic acid, hydroxyethyl methacrylate-maleate, hydroxyethyl acrylate maleate, hydroxypropyl methacrylate maleate, hydroxypropyl acrylate-maleate, dicyclopentadiene maleate, a polyfunctional (meth)acrylate having one carboxyl group and two or more (meth)acryloyl groups, and the like. Among these, acrylic acid, methacrylic acid, and a polyfunctional (meth)acrylate having one carboxyl group and two or more (meth)acryloyl groups are preferred.

The polyfunctional (meth)acrylate having one carboxyl group and two or more (meth)acryloyl groups can be obtained, for example, by reaction of a polyfunctional (meth)acrylate having one hydroxyl group and two or more (meth)acryloyl groups in the molecule with a dibasic acid anhydride or a dibasic carboxylic acid.

As the polyfunctional (meth)acrylate having one carboxyl group and two or more (meth)acryloyl groups, there may be mentioned compounds No. 10 to 14 below.

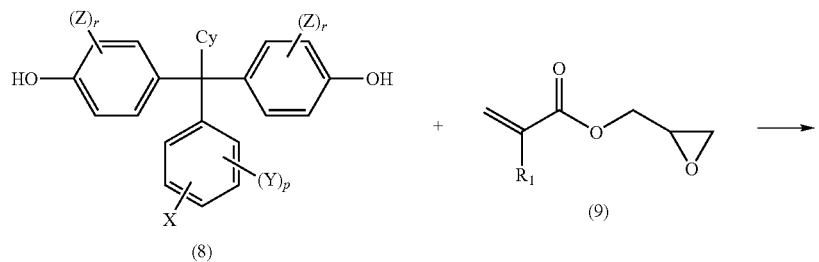

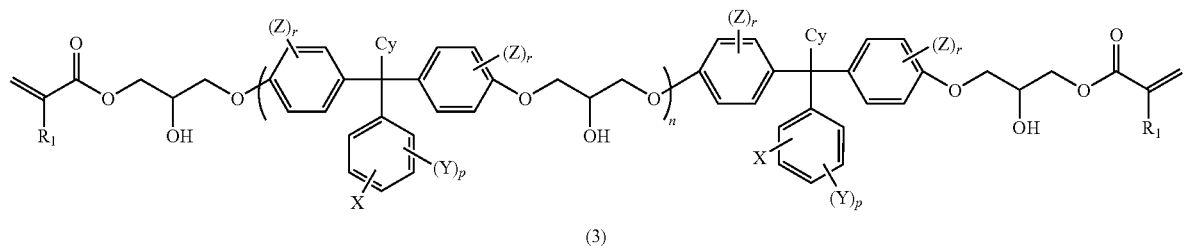

Compound No. 10

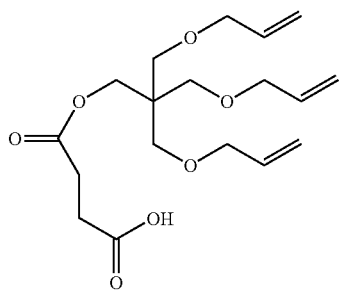

Compound No. 11

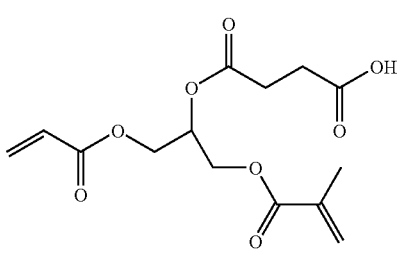

Compound No. 12

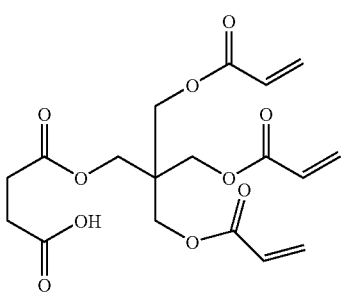

Compound No. 13

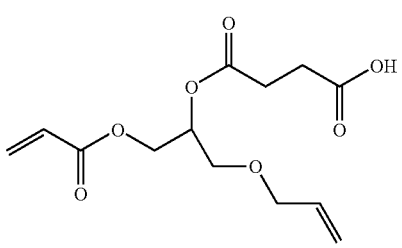

Compound No. 14

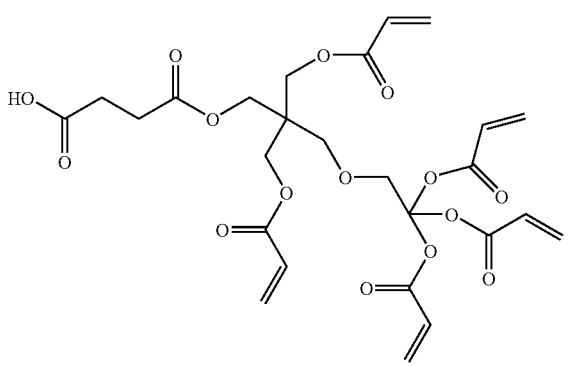

The polybasic acid anhydride (C) used in preparing the alkali-developable resin composition is used for improving pattern shape, ease in developing, and developing speed through an increase in the acid value of the alkali-developable resin composition. The polybasic acid anhydride (C) includes, for example, succinic anhydride, maleic anhydride, trimellitic anhydride, pyromellitic anhydride, 2,2',3,3'-benzophenonetetracarboxylic anhydride, 3,3',4,4'-benzophenonetetracarboxylic anhydride, ethylene glycol bis(anhydrotrimellitate), glycerol tris(anhydrotrimellitate), phthalic anhydride, hexahydrophthalic anhydride, methyltetrahydrophthalic anhydride, tetrahydrophthalic anhydride, nadic anhydride, methylnadic anhydride, trialkyltetrahydrophthalic anhydride, hexahydrophthalic anhydride, 5-(2,5-dioxotetrahydrofuryl)-3-methyl-3-cyclohexene-1,2-dicarboxylic anhydride, (trialkyltetrahydrophthalic anhydride)-(maleic anhydride) adduct, dodecenylsuccinic anhydride, methylhymic anhydride, and the like. Among these, succinic anhydride, trimellitic anhydride, and hexahydrophthalic anhydride are preferred.

The polyfunctional epoxy compound (D) used in preparing the alkali-developable resin composition is used for adjusting the developing speed through an increase in the molecular weight of the photopolymerizable unsaturated compound. The usable polyfunctional epoxy compound (D) includes, for example, a polyglycidyl ether of a polyol or an alkylene oxide adduct thereof, a polyglycidyl ester of a polybasic acid, a compound containing cyclohexene oxide or cyclopentene oxide obtained by epoxidation of a compound containing a cyclohexene ring or cyclopentene ring by an oxidizing agent, and the like. Specifically, there may be mentioned the following compounds.

That is, an alkylidenebisphenol polyglycidyl ether-type epoxy resin such as bisphenol A-type epoxy resin, bisphenol B-type epoxy resin, bisphenol C-type epoxy resin, bisphenol E-type epoxy resin, bisphenol F-type epoxy resin, bisphenol M-type epoxy resin, bisphenol P-type epoxy resin, bisphenol S-type epoxy resin, bisphenol Z-type epoxy resin, and the like; a hydrogenated bisphenol type diglycidyl ether obtained by hydrogenation of the above alkylidenebisphenol polyglycidyl ether-type epoxy resin; a glycidyl ether of an aliphatic polyol such as ethylene glycol diglycidyl ether, 1,3-propylene glycol diglycidyl ether, 1,2-propylene glycol diglycidyl ether, 1,4-butanediol diglycidyl ether, 1,6-hexanediol diglycidyl ether, 1,8-octanediol diglycidyl ether, 1,10-decanediol diglycidyl ether, 2,2-dimethyl-1,3-propanediol diglycidyl ether, diethylene glycol diglycidyl ether, triethylene glycol diglycidyl ether, tetraethylene glycol diglycidyl ether, hexaethylene glycol diglycidyl ether, 1,4-cyclohexanedimethanol diglycidyl ether, 1,1,1-tri(glycidyloxymethyl)propane, 1,1,1-tri(glycidyloxymethyl)ethane, 1,1,1-tri(glycidyloxymethyl)methane, 1,1,1,1-tetra(glycidyloxymethyl)methane, glycerin triglycidyl ether, trimethylolpropane triglycidyl ether, sorbitol tetraglycidyl ether, dipentaerythrytol hexaglycidyl ether and the like; a polyglycidyl ether of a polyether polyol obtained by adding two or more kinds of alkylene oxides to a polyol such as propylene glycol, trimethylolpropane, glycerin, and the like; a novolak-type epoxy compound such as phenol novolak-type epoxy compound, biphenyl novolak-type epoxy compound, cresol novolak-type epoxy compound, bisphenol A novolak-type epoxy compound, dicyclopentadiene novolak-type epoxy compound, and the like; an alicyclic epoxy compound such as 3,4-epoxy-3-methylcyclohexylmethyl-3,4-epoxy-3-methylcyclohexanecarboxylate, 3,4-epoxy-5-methylcyclohexylmethyl-3,4-epoxy-5-methylcyclohexanecarboxylate, 3,4-epoxy-6-methylcyclohexylmethyl-3,4-epoxy-6-methylcyclohexanecarboxylate, 3,4-epoxycyclohexylmethyl-3,4-epoxycyclohexanecarboxylate, 1-epoxyethyl-3,4-epoxycyclohexane, bis(3,4-epoxycyclohexylmethyl) adipate, methylenebis(3,4-epoxycyclohexane), isopropylidenebis(3,4-epoxycyclohexane), dicyclopentadiene diepoxide, ethylene bis(3,4-epoxycyclohexanecarboxylate), 1,2-epoxy-2-epoxyethylcyclohexane, and the like; a glycidyl ester of a dibasic acid such as diglycidyl phthalate, diglycidyl tetrahydrophthalate, diglycidyl ester of dimer acid, and the like; a glycidylamine such as tetraglycidyldiaminodiphenylmethane, triglycidyl-p-aminophenol, N,N-diglycidylaniline, and the like; a heterocyclic epoxy compound such as 1,3-diglycidyl-5,5-dimethylhydantoin triglycidyl isocyanulate, and the like; a dioxide compound such as dicyclopentadiene dioxide, and the like; a naphthalene-type epoxy compound, a triphenylmethane-type epoxy compound, a dicyclopentadiene-type epoxy compound, and the like.

As the polyfunctional epoxy compound, commercially available compounds may also be used. For example, there may be mentioned BREN-S, EPPN-201, EPPN-501N, EOCN-1020, GAN, GOT (Nippon Kayaku Co. Ltd.), Adeka Resin EP-4000, Adeka Resin EP-4003S, Adeka Resin EP-4080, Adeka Resin EP-4085, Adeka Resin EP-4088, Adeka Resin EP-4100, Adeka Resin EP-4900, Adeka Resin ED-505, Adeka Resin ED-506, Adeka Resin KRM-2110, Adeka Resin KRM-2199, Adeka Resin KRM-2720 (Adeka Corporation), R-508, R-531, R-710 (Mitsui Chemicals, Inc.), Epicoat 190P, Epicoat 191P, Epicoat 604, Epicoat 801, Epicoat 828, Epicoat 871, Epicoat 872, Epicoat 1031, Epicoat RXE15, Epicoat YX-4000, Epicoat YDE-205, Epicoat YDE-305 (Japan Epoxy Resins Co., Ltd.), Sumiepoxy ELM-120, Sumiepoxy ELM-434 (Sumitomo Chemical Co., Ltd.), Denacoal EM-150, Denacoal EX-201, Denacoal EX-211, Denacoal EX-212, Denacoal EX-313, Denacoal EX-314, Denacoal EX-322, Denacoal EX-411, Denacoal EX-421, Denacoal EX-512, Denacoal EX-521, Denacoal EX-614, Denacoal EX-711, Denacoal EX-721, Denacoal EX-731, Denacoal EX-811, Denacoal EX-821, Denacoal EX-850, Denacoal EX-851, Denacoal EX-911 (Nagase chemteX Corporation), Epolite 70P, Epolite 200P, Epolite 400P, Epolite 40E, Epolite 100E, Epolite 200E, Epolite 400E, Epolite 80MF, Epolite 100MF, Epolite 1500NP, Epolite 1600, Epolite 3002, Epolite 4000, Epolite FR-1500, Epolite M-1230, Epolite EHDG-L (Kyoeisha Chemical Co., Ltd.), SB-20 (Okamura Oil Mill, Ltd.), Epicron 7200 (Dainippon Ink and Chemicals, Incorporated), UVR-6100, UVR-6105, UVR-6110, UVR-6200, UVR-6228 (Union Carbide Corporation), Celoxide 2000, Celoxide 2021, Celoxide 2021P, Celoxide 2081, Celoxide 2083, Celoxide 2085, Celoxide 3000, Cyclomer A200, Cyclomer M100, Cyclomer M101, Epolead GT-301, Epolead GT-302, Epolead 401, Epolead 403, Epolead HD300, EHPE-3150, ETHB, Epoblend (Daicel Chemical Industries, Ltd.), PY-306, 0163, DY-022 (Chiba Specialty Chemicals Co., Ltd.), Suntohto ST0000, Epotohto YD-011, Epotohto YD-115, Epotohto YD-127, Epotohto YD-134, Epotohto YD-172, Epotohto YD-6020, Epotohto YD-716, Epotohto YD-7011R, Epotohto YD-901, Epotohto YDPN-638, Epotohto YH-300, Neotohto PG-202, Neotohto PG-207 (Tohto Kasei Co. Ltd.), Blenmer G (NOF Corporation), and the like.

The reaction product contained in the alkali-developable resin composition in the present invention may be further reacted with an epoxy compound (G). The epoxy compound (G) is used for further improving ease in developing of the colored alkali-developable photosensitive resin composition of the present invention through adjustment of the acid value. A monofunctional epoxy compound is used as the epoxy compound (G), and specific example thereof includes glycidyl methacrylate, methyl glycidyl ether, ethyl glycidyl ether, propyl glycidyl ether, isopropyl glycidyl ether, butyl glycidyl ether, isobutyl glycidyl ether, t-butyl glycidyl ether, pentyl glycidyl ether, hexyl glycidyl ether, heptyl glycidyl ether, octyl glycidyl ether, nonyl glycidyl ether, decyl glycidyl ether, undecyl glycidyl ether, dodecyl glycidyl ether, tridecyl glycidyl ether, tetradecyl glycidyl ether, pentadecyl glycidyl ether, hexadecyl glycidyl ether, 2-ethylhexyl glycidyl ether, allyl glycidyl ether, propargyl glycidyl ether, 2-methoxyethyl glycidyl ether, phenyl glycidyl ether, p-methoxy phenyl glycidyl ether, p-butyl phenyl glycidyl ether, cresyl glycidyl ether, 2-methylcresyl glycidyl ether, 4-nonylphenyl glycidyl ether, benzyl glycidyl ether, p-cumylphenyl glycidyl ether, trityl glycidyl ether, 2,3-epoxypropyl methacrylate, epoxidated soybean oil, epoxidated linseed oil, glycidyl butyrate, vinylcyclohexane monooxide, 1,2-epoxy-4-vinylcyclohexane, styrene oxide, pinene oxide, methylstyrene oxide, cyclohexene oxide, propylene oxide, compounds No. 15 and No. 16 below, and the like.

The acid value of the solid content in the alkali-developable resin composition of the present invention is preferably in the range of 20 to 120 mgKOH/g, and it is preferred to use the epoxy compound (G) in an amount selected so as to satisfy the above acid value.

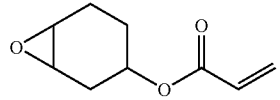

Compound No. 15

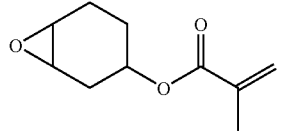

Compound No. 16

The alkali-developable resin composition is usually used, as a solution-phase composition added with a solvent that can dissolve or disperse each of the above components, for the colored alkali-developable photosensitive resin composition of the present invention.

Usually, there are no particular limitations on the solvent as long as it can dissolve or disperse each of the above components. For example, there may be mentioned ketones such as methyl ethyl ketone, methyl amyl ketone, diethyl ketone, acetone, methyl isopropyl ketone, methyl isobutyl ketone, cyclohexanone, and the like; ethereal solvents such as ethyl ether, dioxane, tetrahydrofuran, 1,2-dimethoxyethane, 1,2-diethoxyethane, dipropylene glycol dimethyl ether, and the like; ester-type solvents such as methyl acetate, ethyl acetate, n-propyl acetate, isopropyl acetate, n-butyl acetate, and the like; cellosolve-type solvents such as ethylene glycol monomethyl ether, ethylene glycol monoethyl ether, propylene glycol monomethyl ether acetate, and the like; alcoholic solvents such as methanol, ethanol, iso- or n-propanol, iso- or n-butanol, amyl alcohol, and the like; BTX-type solvents such as benzene, toluene, xylene, and the like; aliphatic hydrocarbon solvents such as hexane, heptane, octane, cyclohexane, and the like; terpene-type hydrocarbon oils such as terpine oil, D-limonene, and pinene; paraffinic solvents such as mineral spirit, Swazole #310 (Cosmo Matsuyama Oil Co. Ltd.), Solvesso #100 (Exxon Chemical Ltd.), and the like; halogenated aliphatic hydrocarbon solvents such as carbon tetrachloride, chloroform, trichloroethylene, methylene chloride, and the like; halogenated aromatic hydrocarbon solvents such as chlorobenzene, and the like; carbitol-type solvents, aniline, triethylamine, pyridine, acetic acid, acetonitrile, carbon disulfide, tetrahydrofuran, N,N-dimethylformamide, N-methylpyrrolidone, and the like. Among these, ketones and cellosolve-type solvents are preferred. These solvents may be used singly or as a mixture of two or more kinds thereof.

In the colored alkali-developable photosensitive resin composition of the present invention, it is recommended that the content of the solvent is adjusted so that the total solid content in the colored alkali-developable photosensitive resin composition may be 5% to 40% by mass, particularly 15% to 30% by mass.

The solvent is preferably used in such an amount that the solution-phase composition contains 1% to 70% by weight, particularly 3% to 30% by weight, of the reaction product obtained by esterification of the epoxy adduct, which has a structure in which the component (B) is added to the component (A), with the component (C) and then with the component (D) and, if necessary, subsequent reaction with the component (G).

The coloring material (E) used in the colored alkali-developable photosensitive resin composition of the present invention includes pigments and dyes. There are no particular limitations on which to add, and either a pigment or a dye may be used or both may be used together. The pigment and the dye are preferably incorporated, in particular, by the pigment dispersion method and the dyeing method, respectively.

As the pigment used in the colored alkali-developable photosensitive resin composition of the present invention, a single pigment may be used or a plurality of pigments may be used in combination.

Specific examples of the organic pigments are listed by the color index (C.I.) number below.

Pigment Blue:
<C. I.> 1, 1:2, 1:x, 9:x, 15, 15:1, 15:2, 15:3, 15:4, 15:5, 15:6, 16, 24, 24:x, 56, 60, 61, 62

Pigment Green:
<C. I.> 1, 1:x, 2, 2:x, 4, 7, 10, 36

Pigment Orange:
<C. I.> 2, 5, 13, 16, 17:1, 31, 34, 36, 38, 43, 46, 48, 49, 51, 52, 59, 60, 61, 62, 64

Pigment Red:
<C. I.> 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:3, 81:x, 83, 88, 90, 112, 119, 122, 123, 144, 146, 149, 166, 168, 169, 170, 171, 172, 175, 176, 177, 178, 179, 184, 185, 187, 188, 190, 200, 202, 206, 207, 208, 209, 210, 216, 224, 226

Pigment Violet:
<C. I.> 1, 1:x, 3, 3:3, 3:x, 5:1, 19, 23, 27, 32, 42

Pigment Yellow:
<C. I.> 1, 3, 12, 13, 14, 16, 17, 24, 55, 60, 65, 73, 74, 81, 83, 93, 95, 97, 98, 100, 101, 104, 106, 108, 109, 110, 113, 114, 116, 117, 119, 120, 126, 127, 128, 129, 138, 139, 150, 151, 152, 153, 154, 156, 175

As the black pigment, there may be mentioned carbon black manufactured by Mitsubishi Chemical Corporation, #2400, #2350, #2300, #2200, #1000, #980, #970, #960, #950, #900, #850, MCF88, #650, MA600, MA7, MA8, MA11, MA100, MA220, IL30B, IL31B, IL7B, IL11B, IL52B, #4000, #4010, #55, #52, #50, #47, #45, #44, #40, #33, #32, #30, #20, #10, #5, CF9, #3050, #3150, #3250, #3750, #3950, Diablack A, Diablack N220M, Diablack N234, Diablack I, Diablack LI, Diablack LH, Diablack N339, Diablack SH, Diablack SHA, Diablack LH, Diablack H, Diablack HA, Diablack SF, Diablack N550M, Diablack E, Diablack G, Diablack R, Diablack N760M, and Diablack LR; carbon black manufactured by Cancarb Ltd., Thermax N990, N991, N907, N908, N990, N991 and N908; carbon black manufacture by Asahi Carbon Co., Ltd., Asahi #80, Asahi #70, Asahi #70L, Asahi F-200, Asahi #66, Asahi #66U, Asahi #50, Asahi #35, Asahi #15, and AsahiThermal; carbon black manufactured by Deggusa AG, ColorBlack Fw200, ColorBlack Fw2, ColorBlack Fw2V, ColorBlack Fw1, ColorBlack Fw18, ColorBlack S170, ColorBlack S160, SpecialBlack 6, SpecialBlack 5, SpecialBlack 4, SpecialBlack 4A, SpecialBlack 250, SpecialBlack 350, PrintexU, PrintexV, Printex140U, and Printex140V (trade name hereinabove); and the like.

Inorganic pigments are also usable including Milori blue, iron oxide, titanium oxide, calcium carbonate, magnesium carbonate, silica, alumina, cobalt-based pigments, manganese-based pigments, talc, chromate salts, ferrocyanates, various kinds of metal sulfates, sulfides, selenides, phosphate salt ultramarine blue, iron blue, cobalt blue, cerulean blue, viridian, emerald green, cobalt green, and the like.

A plurality of these pigments may be used as a mixture.

As the dyes, there may be mentioned azo dyes, anthraquinone dyes, indigoid dyes, triarylmethane dyes, xanthene dyes, alizarin dyes, acridine dyes, stilbene dyes, thiazole dyes, naphthol dyes, quinoline dyes, nitro dyes, indamine dyes, oxazine dyes, phthalocyanine dyes, cyanine dyes, and the like. A plurality of these dyes may be used as a mixture.

In the colored alkali-developable photosensitive resin composition of the present invention, the content of the coloring material (E) is preferably 3% to 70% by weight, particularly 5% to 60% by weight, with respect to the alkali-developable resin composition prepared as a solution-phase composition.

As the photopolymerization initiator (F) used for the colored alkali-developable photosensitive resin composition of the present invention, conventionally known compounds may be used. There may be mentioned, for example, benzophenone, phenyl biphenyl ketone, 1-hydroxy-1-benzoylcyclohexane, benzil, benzil dimethyl ketal, 1-benzyl-1-dimethylamino-1-(4'-morpholinobenzoyl)propane, 2-morpholyl-2-(4'-methylthio)benzoylpropane, thioxanthone, 1-chloro-4-propoxythioxanthone, isopropylthioxanthone, diethylthioxanthone, ethylanthraquinone, 4-benzoyl-4'-methyldiphenyl sulfide, benzoin butyl ether, 2-hydroxy-2-benzoylpropane, 2-hydroxy-2-(4'-isopropyl)benzoylpropane, 4-butylbenzoyltrichloromethane, 4-phenoxybenzoyldichloromethane, methyl benzoylformate, 1,7-bis(9'-acridinyl)heptane, 9-n-butyl-3,6-bis(2'-morpholinoisobutyroyl)carbazole, 2-methyl-1-[4-(methylthio)phenyl]-2-morpholinopropan-1-one, 2-methyl-4,6-bis(trichloromethyl)-s-triazine, 2-phenyl-4,6-bis(trichloromethyl)-s-triazine, 2-naphthyl-4,6-bis(trichloromethyl)-s-triazine, compounds No. 17 and No. 18 below, and the like. Among these, benzophenone and 2-methyl-1-[4-(methylthio)phenyl]-2-morpholinopropan-1-one are preferred.

Compound No. 17

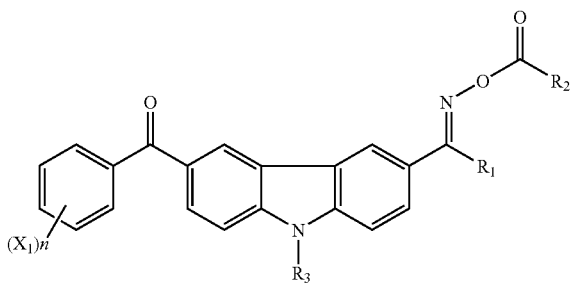

wherein $X_1$ represents a halogen atom or an alkyl group, $R_1$ represents R, OR, COR, SR, CONRR', or CN, $R_2$ represents R, OR, COR, SR, or NRR', and $R_3$ represents R, OR, COR, SR, or NRR'. Each of R and R' represents an alkyl group, an aryl group, an aralkyl group or a heterocyclic group, which are optionally substituted with a halogen atom and/or a heterocyclic group, and the alkylene moiety in the alkyl group and the aralkyl group may be interrupted by an unsaturated bond, an ether bond, a thioether bond or an ester bond. R and R' together may form a ring. n is 0 to 5.

Compound No. 18

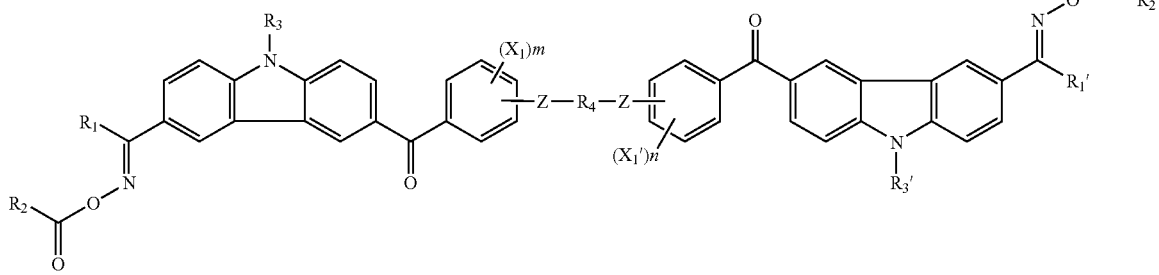

wherein $X_1$, $R_1$, $R_2$, $R_3$, R, and R' are the same as those in compound No. 17 above, $X_1'$ represents a halogen atom or an alkyl group, Z represents an oxygen atom or a sulfur atom, each of m and n represents a number of 1 to 5, $R_1'$ represents R, OR, COR, SR, CONRR' or CN, $R_2'$ represents R, OR, COR, SR, or NRR', $R_3'$ represents R, OR, COR, SR, or NRR', and $R_4$ represents a group originating from a diol or a group originating from a dithiol.

In the colored alkali-developable photosensitive resin composition of the present invention, the content of the photopolymerization initiator (F) is preferably 0.1% to 30% by weight, particularly 0.5% to 5% by weight, with respect to the alkali-developable resin composition of the present invention prepared as a solution-phase composition added with a solvent.

The colored alkali-developable photosensitive resin composition of the present invention may further contain a monomer having an unsaturated bond, a chain transfer agent, a surfactant, and the like.

As the monomer having an unsaturated bond, there may be mentioned 2-hydroxyethyl acrylate, 2-hydroxypropyl acrylate, isobutyl acrylate, n-octyl acrylate, isooctyl acrylate, isononyl acrylate, stearyl acrylate, methoxyethyl acrylate, dimethylaminoethyl acrylate, zinc acrylate, 1,6-hexanediol diacrylate, trimethylolpropane triacrylate, 2-hydroxyethyl methacrylate, 2-hydroxypropyl methacrylate, butyl methacrylate, tert-butyl methacrylate, cyclohexyl methacrylate, trimethylolpropane trimethacrylate, dipentaerythrytol pentaacrylate, dipentaerythrytol hexaacrylate, pentaerythrytol tetraacrylate, pentaerythrytol triacrylate, tricyclodecanedimethylol diacrylate, and the like.

As the chain-transfer agent, there may be mentioned mercapto compounds such as thioglycolic acid, thiomalic acid, thiosalicyclic acid, 2-mercaptopropionic acid, 3-mercaptopropionic acid, 3-mercaptobutyric acid, N-(2-mercaptopropionyl)glycine, 2-mercaptonicotinic acid, 3-[N-(2-mercaptoethyl)carbamoyl]propionic acid, 3-[N-(2-mercaptoethyl)amino]propionic acid, N-(3-mercaptopropionyl)alanine, 2-mercaptoethanesulfonic acid, 3-mercaptopropanesulfonic acid, 4-mercaptobutanesulfonic acid, dodecyl (4-methylthio)phenyl ether, 2-mercaptoethanol, 3-mercapto-1,2-propanediol, 1-mercapto-2-propanol, 3-mercapto-2-butanol, mercaptophenol, 2-mercaptoethylamine, 2-mercaptoimidazole, 2-mercapto-3-pyridinol, 2-mercaptobenzothiazole, mercaptoacetic acid, trimethylolpropane tris(3-mercaptopropionate), pentaerythrytol tetrakis(3-mercaptopropionate), and the like; disulfide compounds obtained by oxidation of the above mercapto compounds; and iodoalkyl compounds such as iodoacetic acid, iodopropionic acid, 2-iodoethanol, 2-iodoethanesulfonic acid, 3-iodopropanesulfonic acid, and the like.

As the surfactant, there may be mentioned fluorine-containing surfactants such as perfluoroalkyl phosphate esters, perfluoroalkylcarboxylate salts, and the like, anionic surfactants such as alkali salts of higher fatty acids, alkylsulfonate salts, alkylsulfate salts, and the like, cationic surfactants such as halogen acid salts of higher amines, quaternary ammonium salts, and the like, nonionic surfactants such as polyethylene glycol alkyl ethers, polyethylene glycol fatty acid esters, sorbitane fatty acid esters, fatty acid monoglycerides, and the like, amphoteric surfactants, silicone-based surfactants, and the like. These surfactants may be used in combination.

In the colored alkali-developable photosensitive resin composition of the present invention, the properties of the cured article may be improved by further using a thermoplastic organic polymer. The thermoplastic organic polymer includes, for example, polystyrene, poly(methyl methacrylate), methyl methacrylate-ethyl acrylate copolymer, poly(meth)acrylic acid, styrene-(meth)acrylic acid copolymer, (meth)acrylic acid-methyl methacrylate copolymer, polyvinyl butyral, cellulose ester, polyacrylamide, saturated polyesters, and the like.

In the colored alkali-developable photosensitive resin composition of the present invention, one may add, as necessary, conventional additives including a thermal polymerization inhibitor such as anisole, hydroquinone, pyrocatechol, tert-butylcatechol, phenothiazine, and the like; a plasticizer; an adhesion promoter; a filler; an antifoamer; a leveling agent, and the like.

The colored alkali-developable photosensitive resin composition of the present invention is applied onto a supporting base substance made of metal, paper, plastics or the like by a publicly known method such as roll coating, curtain coating, various types of printing, immersing, and the like. Further, after the composition is once applied onto a supporting base substance such as film, it can be transcribed to another supporting substance. There are no limitations on the method for application.

The colored alkali-developable photosensitive resin composition of the present invention has no particular limitations on the use thereof and may be employed in various use including photocurable paints, photocurable adhesives, printing plates, photoresists for printed wiring boards, and the like. Particularly, it is suitably used for forming pixel parts in color filters used for liquid crystal displays, plasma displays, electroluminescence panels, video cameras, and the like.

As an activating light source used for curing the colored alkali-developable photosensitive resin composition of the present invention, a light source emitting light with a wavelength of 300 nm to 450 nm may be used. For example, a super-high pressure mercury lamp, a mercury vapor arc, a carbon arc, a xenon arc and the like may be used.

In the following, a color filter of the present invention and a liquid crystal display apparatus comprising the color filter will be described with preferred embodiments.

The color filter of the present invention comprises at least a light-transmitting base material and a color filter layer composed of a pixel pattern with a plurality of colors, wherein at least one color in the pixel pattern with the plurality of colors is a cured article of the alkali-developable photosensitive resin composition of the present invention containing a coloring material; or comprises at least a light-transmitting base material and a color filter layer composed of a pixel pattern with a plurality of colors and a black matrix, wherein the black matrix is a cured material of the colored alkali-developable photosensitive resin composition of the present invention containing a coloring material.

As the light-transmitting base material in the color filter of the present invention, any material having a certain degree of stiffness and smoothness may be used without particular limitation. However, when the color filter is used in transmission mode, the base material is further required to have transparency.

As the usable light-transmitting base material, there may be mentioned glass and plastic films made of PET (polyethylene terephthalate), acrylic resin, or the like. The base material may be provided in advance with a black matrix made of the colored alkali-developable photosensitive resin composition of the present invention, another photosensitive resin composition, or a metal such as chromium, and the like.

One example of the method for producing the color filter of the present invention will be described below.

First, a transparent substrate such as glass, and the like is coated with the colored alkali-developable photosensitive resin composition of the present invention by a publicly known method such as spin coating, roll coating, curtain coating, and the like. Then, the substrate is exposed to light through a photomask with a given pattern, and unexposed parts are removed with an aqueous solution containing an alkali such as sodium carbonate, and the like to develop the pattern. This procedure is repeated until the desired number of colors of transparent colored coated films (a pixel pattern) are formed to obtain the color filter of the present invention.

Since the colored alkali-developable photosensitive resin composition of the present invention has an excellent photosensitivity, it is not required to form an oxygen-blocking film. However, there may be provided a step for forming an oxygen-blocking film before the step of exposing for further improving the photosensitivity.

The above method can also be employed not only for forming the transparent colored coated films but also for forming the black matrix. In addition, instead of applying onto a substrate, the colored alkali-developable photosensitive resin composition may once be applied onto a transcription support such as a so-called blanket, a film, and the like held on a cylindrical transcription barrel, followed by transcription of the coated film to the substrate.

The color filter using the colored alkali-developable photosensitive resin composition of the present invention is similar to a conventional color filter except that the colored alkali-developable photosensitive resin composition of the present invention is used for forming a pixel pattern with a plurality of colors and/or a black matrix. The color filter may have different composing elements depending on the use thereof, and there are no limitations on the configuration. In general, the color filter is composed of a light-transmitting base material, multi-colored transparent coated films arranged to form a pattern onto the light-transmitting base material, and optionally a black matrix arranged as necessary. White light incident onto these coating films is transformed into the colors of the coated films.

When the color filter of the present invention is used for a liquid crystal display apparatus, it may be installed to the liquid crystal display device similarly to a conventional color filter. In a liquid crystal display device such as a liquid crystal display, a plasma display, an electroluminescence panel, and the like, generally, light from a light source housed in the display, sunlight incident onto the screen of the display, or the like is used as incident light, and a color screen can be displayed with colored light transmitted through the color filter.

Furthermore, in an image sensor used for a solid-state imaging apparatus such as a color video camera, a digital camera, and the like, the color filter of the present invention can be employed as a component composing the solid-state imaging elements used in the image sensor. The color filter provided as a component composing the solid-state imaging elements has a function of dispersing light incident from the object to be imaged. The light dispersed here is converted to electric signals in photoreceptor elements, and a color image can be captured by recording the electric signals.

EXAMPLES

The present invention will be described in more detail with reference to Examples and the like, but the present invention is not limited by these examples.

Production Example 1

Production of Alkali-Developable Resin Composition No. 1

<Step 1> Production of 1,1-bis(4'-hydroxyphenyl)-1-(1"-biphenyl)-1-cyclohexylmethane To a mixture of 70.5 g of biphenyl cyclohexyl ketone, 200.7 g of phenol and 10.15 g of thioacetic acid, 40.0 g of trifluoromethanesulfonic acid was added dropwise at 18° C. over 20 minutes. After the mixture was kept at 17° C. to 19° C. for 18 hours, the reaction was stopped by adding 500 g of water, and 500 g of toluene was added here. The organic layer was washed with water until the pH became 3 to 4. The organic layer was collected, and toluene, water, and excess phenol were removed. Toluene was added to the residue, and the resultant solid was collected by filtration and washed by dispersing to toluene to obtain 59.2 g (yield 51%) of light yellow crystalline substance. The melting point of the light yellow crystalline substance was 239.5° C., which confirmed that the light yellow crystalline substance was the desired material.

<Step 2> Production of 1,1-bis(4'-epoxypropyloxyphenyl)-1-(1"-biphenyl)-1-cyclohexylmethane To a mixture of 57.5 g of 1,1-bis(4'-hydroxyphenyl)-1-(1"-biphenyl)-1-cyclohexylmethane obtained in Step 1 and 195.8 g of epichlorohydrin, 0.602 g of benzyltriethylammonium chloride was added. The reaction mixture was stirred at 64° C. for 18 hours. Then the mixture was cooled down to 54° C., 43.0 g of aqueous solution containing 24 wt % of sodium hydroxide was added dropwise here, and the resultant mixture was stirred for 30 minutes. Epichlorohydrin and water were removed and 216 g of methyl isobutyl ketone was added to the residue. The resultant solution was washed with water, and then 2.2 g of aqueous solution containing 24 wt % of sodium hydroxide was added dropwise. After stirred at 80° C. for 2 hours, the reaction mixture was cooled down to room temperature, neutralized with an aqueous solution containing 3 wt % of monosodium phosphate, and washed with water. The solvent was removed to obtain 57 g (yield 79%) of a yellow solid (melting point 64.2° C., epoxy equivalent 282, n=0.04). It was confirmed that the yellow solid was the desired material.

<Step 3> Production of Alkali-Developable Resin Composition No. 1

A mixture of 1695 g of 1,1-bis(4'-epoxypropyloxyphenyl)-1-(1"-biphenyl)-1-cyclohexylmethane (hereinafter, also called Compound a) obtained in Step 2, 443 g of acrylic acid (hereinafter, also called Compound b-1), 6 g of 2,6-di-tert-butyl-p-cresol, 11 g of tetrabutylammonium acetate, and 1425 g of propylene glycol-1-monomethyl ether-2-acetate was stirred at 120° C. for 16 hours. The reaction mixture was cooled to room temperature, 718 g of propylene glycol-1-monomethyl ether-2-acetate, 482 g of succinic anhydride (hereinafter, also called Compound c-1), and 25 g of tetrabutylammonium acetate were added here, and the resultant mixture was stirred at 100° C. for 5 hours. Further, 508 g of 1,1-bis(4'-epoxypropyloxyphenyl)-1-(1"-biphenyl)-1-cyclohexylmethane (hereinafter, also called Compound d-1) obtained in Step 2 and 218 g of propylene glycol-1-monomethyl ether-2-acetate were added, and the resultant mixture was stirred at 120° C. for 12 hours, at 80° C. for 2 hours, and at 40° C. for 2 hours. After that, 1463 g of propylene glycol-1-monomethyl ether-2-acetate was added to obtain the desired material, alkali-developable resin composition No. 1, as a solution in propylene glycol-1-monomethyl ether-2-acetate (Mw=4200, Mn=2100, acid value of the solid content 55 mgKOH/g).

In obtaining the reaction product contained in alkali-developable resin composition No. 1, the epoxy adduct having a structure in which the component (B), Compound b-1, was added to the component (A), Compound a, was esterified with the component (C), Compound c-1, and with the component (D), Compound d-1, so that the ratio of the acid anhydride moiety in Compound c-1 to the hydroxyl group in the epoxy adduct was 0.8 and that of the epoxy group in Compound d was 0.3. The epoxy adduct had a structure in which the carboxyl group in Compound b was added to the epoxy group in Compound a in a ratio of the carboxyl group to the epoxy group of 1.0.

Production Example 2

Production of Alkali-Developable Resin Composition No. 2

A mixture of 43 g of 1,1-bis(4'-epoxypropyloxyphenyl)-1-(1"-biphenyl)-1-cyclohexylmethane (Compound a) obtained in Step 2 of Production Example 1, 33.6 g of acrylic acid (Compound b-1), 0.04 g of 2,6-di-tert-butyl-p-cresol, 0.21 g of tetrabutylammonium acetate, and 18 g of propylene glycol-1-monomethyl ether-2-acetate was stirred at 120° C. for 13 hours. The reaction mixture was cooled to room temperature, 24 g of propylene glycol-1-monomethyl ether-2-acetate and 10 g of succinic anhydride (Compound c-1) were added here, and the resultant mixture was stirred at 100° C. for 3 hours. Further, 8 g of bisphenol Z glycidyl ether (Compound d-2) was added, the resultant mixture was stirred at 120° C. for 4 hours, at 90° C. for 3 hours, at 60° C. for 2 hours, and at 40° C. for 5 hours, and then 29 g of propylene glycol-1-monomethyl ether-2-acetate was added to obtain the desired material, alkali-developable resin composition No. 2, as a solution in propylene glycol-1-monomethyl ether-2-acetate (Mw=4600, Mn=2100, acid value of the solid content 54 mgKOH/g).

In obtaining the reaction product contained in alkali-developable resin composition No. 2, the epoxy adduct having a structure in which the component (B), Compound b-1, was added to the component (A), Compound a, was esterified with the component (C), Compound c-1, and with the component (D), Compound d-2, so that the ratio of the acid anhydride moiety in Compound c-1 to the hydroxyl group in the epoxy adduct was 0.8 and that of the epoxy group in Compound d-2 was 0.3. The epoxy adduct had a structure in which the carboxyl group in Compound b was added to the epoxy group in Compound a in a ratio of the carboxyl group to the epoxy group of 1.0.

Production Example 3

Production of Alkali-Developable Resin Composition No. 3

A mixture of 1695 g of 1,1-bis(4'-epoxypropyloxyphenyl)-1-(1"-biphenyl)-1-cyclohexylmethane (Compound a) obtained in Step 2 of Production Example 1, 443 g of acrylic acid (Compound b-1), 6 g of 2,6-di-tert-butyl-p-cresol, 11 g of tetrabutylammonium acetate, and 1425 g of propylene glycol-1-monomethyl ether-2-acetate was stirred at 120° C. for 16 hours. The reaction mixture was cooled to room temperature, 931 g of propylene glycol-1-monomethyl ether-2-acetate, 741 g of hexahydrophthalic anhydride (hereinafter, also called Compound c-2), and 25 g of tetra-n-butylammonium acetate were added here, and the resultant mixture was stirred at 70° C. for 4 hours. Further, 313 g of ethylene glycol diglycidyl ether (hereinafter, also called Compound d-3) and 1463 g of propylene glycol-1-monomethyl ether-2-acetate were added to obtain the desired material, alkali-developable resin composition No. 3, as a solution in propylene glycol-1-monomethyl ether-2-acetate (Mw=3000, Mn=1700, acid value of the solid content 43 mgKOH/g).

In obtaining the reaction product contained in alkali-developable resin composition No. 3, the epoxy adduct having a structure in which the component (B), Compound b-1, was added to the component (A), Compound a, was esterified with the component (C), Compound c-2, and with the component (D), Compound d-3, so that the ratio of the acid anhydride moiety in Compound c-2 to the hydroxyl group in the epoxy adduct was 0.8 and that of the epoxy group in Compound d-3 was 0.4. The epoxy adduct had a structure in which the carboxyl group in Compound b was added to the epoxy group in Compound a in a ratio of the carboxyl group to the epoxy group of 1.0.

Production Example 4

Production of Alkali-Developable Resin Composition No. 4

A mixture of 37.3 g of Light Acrylate PE-3A (acrylic acid derivative, manufactured by Kyoeisha Chemical Co., Ltd.), 12.5 g of succinic anhydride, 0.087 g of triphenylphosphine, and 0.050 g of 2,6-di-tert-butyl-p-cresol was stirred at 100° C. for 3 hours to obtain an unsaturated monobasic acid containing polyfunctional acrylic groups (hereinafter, also called as Compound b-2). This mixture was cooled to room temperature, 138 g of 1,1-bis(4'-epoxypropyloxyphenyl)-1-(1"-biphenyl)-1-cyclohexylmethane (Compound a), 27.7 g of acrylic acid (Compound b-1), 0.51 g of 2,6-di-tert-butyl-p-cresol, 0.90 g of tetrabutylammonium acetate, and 144 g of propylene glycol-1-monomethyl ether-2-acetate were added, and the mixture was stirred at 120° C. for 12 hours. The mixture was cooled to room temperature, 65.4 g of propylene glycol-1-monomethyl ether-2-acetate, 40.0 g of succinic anhydride (Compound c-1), and 2.1 g of tetrabutylammonium acetate were added, and the resultant mixture was stirred at 100° C. for 5 hours. Further, 41.4 g of 1,1-bis(4'-epoxypropyloxyphenyl)-1-(1"-biphenyl)-1-cyclohexylmethane (Compound d-1), 0.56 g of 2,6-di-tert-butyl-p-cresol, and 18.0 g of propylene glycol-1-monomethyl ether-2-acetate were added, and the mixture was stirred at 90° C. for 1 hour and at 120° C. for 8 hours. The mixture was cooled to room temperature, and 136 g of propylene glycol-1-monomethyl ether-2-acetate was added to obtain the desired material, alkali-developable resin composition No. 4, as a solution in propylene glycol-1-monomethyl ether-2-acetate (Mw=6700, Mn=2700, acid value of the solid content 51 mgKOH/g).

In obtaining the reaction product contained in alkali-developable resin composition No. 4, the epoxy adduct having a structure in which the components (B), Compound b-1 and Compound b-2, were added to the component (A), Compound a, was esterified with the component (C), Compound c-1, and with the component (D), Compound d-1, so that the ratio of the acid anhydride moiety in Compound c-1 to the hydroxyl group in the epoxy adduct was 0.8 and that of the epoxy group in Compound d-1 was 0.3. The epoxy adduct had a structure in which the number of the carboxyl group in Compound b-1 added per epoxy group in Compound a was 0.75 and the number of the carboxyl group in Compound b-2 added per epoxy group in Compound a was 0.25.

Production Example 5

Production of Alkali-Developable Resin Composition No. 5

A mixture of 26.8 g of Light Ester G201P (methacrylic acid derivative, manufactured by Kyoeisha Chemical Co., Ltd.), 12.5 g of succinic anhydride, 0.087 g of triphenylphosphine, and 0.039 g of 2,6-di-tert-butyl-p-cresol was stirred at 100° C. for 3 hours to obtain an unsaturated monobasic acid containing polyfunctional (meth)acryl groups (hereinafter, also called as Compound b-3). This mixture was cooled to room temperature, 138 g of 1,1-bis(4'-epoxypropyloxyphenyl)-1-(1"-biphenyl)-1-cyclohexylmethane (Compound a), 27.7 g of acrylic acid (Compound b-1), 0.50 g of 2,6-di-tert-butyl-p-cresol, 0.90 g of tetrabutylammonium acetate, and 137 g of propylene glycol-1-monomethyl ether-2-acetate were added, and the mixture was stirred at 120° C. for 12 hours. The mixture was cooled to room temperature, 63.8 g of propylene glycol-1-monomethyl ether-2-acetate, 40.0 g of succinic anhydride (Compound c-1), and 2.1 g of tetrabutylammonium acetate were added, and the resultant mixture was stirred at 100° C. for 5 hours. Further, 41.4 g of 1,1-bis(4'-epoxypropyloxyphenyl)-1-(1"-biphenyl)-1-cyclohexylmethane (Compound d-1), 0.56 g of 2,6-di-ter-butyl-p-cresol, and 18.0 g of propylene glycol-1-monomethyl ether-2-acetate were added, and the mixture was stirred at 90° C. for 1 hour and at 120° C. for 8 hours. The mixture was cooled to room temperature, and 132 g of propylene glycol-1-monomethyl ether-2-acetate was added to obtain the desired material, alkali-developable resin composition No. 5, as a solution in propylene glycol-1-monomethyl ether-2-acetate (Mw=4800, Mn=2400, acid value of the solid content 54 mgKOH/g).

In obtaining the reaction product contained in alkali-developable resin composition No. 5, the epoxy adduct having a structure in which the components (B), Compound b-1 and Compound b-3, were added to the component (A), Compound a, was esterified with the component (C), Compound c-1, and with the component (D), Compound d-1, so that the ratio of the acid anhydride moiety in Compound c-1 to the hydroxyl group in the epoxy adduct was 0.8 and that of the epoxy group in Compound d-1 was 0.3. The epoxy adduct had a structure in which the number of the carboxyl group in Compound b-1 added per epoxy group in Compound a was 0.75 and the number of the carboxyl group in Compound b-3 added per epoxy group in Compound a was 0.25.

Comparative Production Example 1

Production of Alkali-Developable Resin Composition No. 6

A mixture of 184 g of a bisphenol-fluorene-type epoxy resin (epoxy equivalent 231), 58 g of acrylic acid, 0.26 g of 2,6-di-tert-butyl-p-cresol, 0.11 g of tetrabutylammonium acetate, and 23 g of propylene glycol-1-monomethyl ether-2-acetate was stirred at 120° C. for 16 hours. The mixture was cooled to room temperature, 35 g of propylene glycol-1-monomethyl ether-2-acetate, and 41 g of tetrahydrophthalic anhydride were added, and the mixture was stirred at 100° C. for 3 hours. Further, 6.5 g of ethylene glycol diglycidyl ether was added, and the mixture was stirred at 120° C. for 4 hours, at 90° C. for 3 hours, at 60° C. for 2 hours, and at 40° C. for 5 hours. To the mixture, 90 g of propylene glycol-1-monomethyl ether-2-acetate was added to obtain alkali-developable resin composition No. 6 as a solution of the desired material in propylene glycol-1-monomethyl ether-2-acetate (Mw=5000, Mn=2100, acid value of the solid content 92.7 mgKOH/g).

Comparative Production Example 2

Production of Alkali-Developable Resin Composition No. 7

A mixture of 154 g of a bisphenol A-type epoxy resin (epoxy equivalent 190), 59 g of acrylic acid, 0.26 g of 2,6-di-tert-butyl-p-cresol, 0.11 g of tetrabutylammonium acetate, and 23 g of propylene glycol-1-monomethyl ether-2-acetate was stirred at 120° C. for 13 hours. The mixture was cooled to room temperature, 365 g of propylene glycol-1-monomethyl ether-2-acetatepropylene glycol-1-monoethyl ether-2-acetate and 45 g of phthalic anhydride were added, and the mixture was stirred at 100° C. for 3 hours. Further, 7.0 g of the bisphenol A-type epoxy resin (epoxy equivalent 190) was added, and the mixture was stirred at 120° C. for 4 hours, at 90° C. for 3 hours, at 60° C. for 2 hours, and at 40° C. for 5 hours. To the mixture, 90 g of propylene glycol-1-monomethyl ether-2-acetatepropylene glycol-1-monoethyl ether-2-acetate was added to obtain alkali-developable resin composition No. 7 as a solution of the desired material in propylene glycol-1-monomethyl ether-2-acetatepropylene glycol-1-monoethyl ether-2-acetate (Mw=7500, Mn=2100, acid value of the solid content 91 mgKOH/g).

Comparative Production Example 3

Production of Alkali-Developable Resin Composition No. 8

<Step 1> Production of 1,1-bis(4'-hydroxyphenyl)-1-(1"-biphenyl)ethane

A mixture of 75 g of phenol and 50 g of 4-acetylbiphenyl was melted with heating at 60° C., and 5 g of 3-mercaptopropionic acid was added here, and the mixture was bubbled with gaseous hydrogen chloride with stirring for 24 hours and then kept for 72 hours to allow the reaction to proceed. After the mixture was washed with warm water of 70° C., volatile materials were removed by heating up to 180° C. under reduced pressure. Xylene was added to the residue and the solution was cooled. The crystalline substance precipitated was collected by filtration and dried in vacuum to obtain 65 g (yield 68%) of a light yellow crystalline substance. The melting point of the light yellow crystalline substance was 184° C., confirming that the light yellow crystalline substance was the desired material.

<Step 2> Production of 1,1-bis(4'-epoxypropyloxy-1phenyl)-1-(1"-biphenyl)ethane

To a mixture of 37 g of 1,1-bis(4'-hydroxyphenyl)-1-(1"-biphenyl)ethane obtained in Step 1 and 149.5 g of epichlorohydrin, 0.45 g of benzyltriethylammonium chloride was added, and the mixture was stirred at 64° C. for 18 hours. Then, the mixture was cooled to 54° C., 32.6 g of an aqueous solution containing 24 wt % of sodium hydroxide was added dropwise, and the resultant mixture was stirred for 30 minutes. Epichlorohydrin and water were removed, 140 g of methyl isobutyl ketone was added, the solution was washed with water, and 1.7 g of an aqueous solution containing 24 wt % of sodium hydroxide was added dropwise. After stirred at 80° C. for 2 hours, the mixture was cooled to room temperature, neutralized with an aqueous solution containing 3 wt % of monosodium phosphate, and washed with water. The solvent was removed to obtain 38.7 g (yield 80%) of a yellow viscous liquid (epoxy equivalent 248, n=0.04). The yellow viscous liquid was confirmed to be the desired material.

<Step 3> Production of Alkali-Developable Resin Composition No. 8

A mixture of 49.6 g of 1,1-bis(4'-epoxypropyloxyphenyl)-1-(1"-biphenyl)ethane obtained in Step 2, 14.4 g of acrylic acid, 0.05 g of 2,6-di-tert-butyl-p-cresol, 0.14 g of tetrabutylammonium acetate, and 27.4 g of propylene glycol-1-monomethyl ether-2-acetatepropylene glycol-1-monoethyl ether-2-acetate was stirred at 120° C. for 13 hours. The mixture was cooled to room temperature, 41.5 g of propylene glycol-1-monomethyl ether-2-acetatepropylene glycol-1-monoethyl ether-2-acetate and 4.3 g of succinic anhydride were added, and the mixture was stirred at 100° C. for 3 hours. Further, 0.34 g of ethylene glycol diglycidyl ether was added, and the mixture was stirred at 120° C. for 4 hours, at 90° C. for 3 hours, at 60° C. for 2 hours, and at 40° C. for 5 hours. To the resultant mixture, 34 g of propylene glycol-1-monomethyl ether-2-acetatepropylene glycol-1-monoethyl ether-2-acetate was added to obtain the desired material, alkali-developable resin composition No. 8, as a solution in propylene glycol-1-monomethyl ether-2-acetatepropylene glycol-1-monoethyl ether-2-acetate (Mw=3700, Mn=1900, acid value of the solid content 93 mgKOH/g).

Example 1

Preparation of Colored Alkali-Developable Photosensitive Resin Composition No. 1

To 12 g of alkali-developable resin composition No. 1 obtained in Production Example 1, 8 g of trimethylolpropane triacrylate, 1.8 g of benzophenone, 3.2 g of carbon black ("MA100" manufactured by Mitsubishi Chemical Corporation), and 75 g of ethyl cellosolve were added, and the mixture was well stirred to obtain colored alkali-developable photosensitive resin composition No. 1.

Example 2

Preparation of Colored Alkali-Developable Photosensitive Resin Composition No. 2

To 12 g of alkali-developable resin composition No. 2 obtained in Production Example 2, 8 g of trimethylolpropane triacrylate, 1.8 g of benzophenone, 3.2 g of carbon black ("MA100" manufactured by Mitsubishi Chemical Corporation), and 75 g of ethyl cellosolve were added, and the mixture was well stirred to obtain colored alkali-developable photosensitive resin composition No. 2.

Example 3

Preparation of Colored Alkali-Developable Photosensitive Resin Composition No. 3

To 12 g of alkali-developable resin composition No. 3 obtained in Production Example 3, 5.6 g of trimethylolpropane triacrylate, 0.6 g of halogenocopper phthalocyanine-based pigment ("6YK" manufactured by Toyo Ink Mfg. Co., Ltd.), 1.8 g of benzophenone, and 80 g of ethyl cellosolve were added, and the mixture was well stirred to obtain colored alkali-developable photosensitive resin composition No. 3.

Example 4

Preparation of Colored Alkali-Developable Photosensitive Resin Composition No. 4

To 12 g of alkali-developable resin composition No. 4 obtained in Production Example 4, 8 g of trimethylolpropane triacrylate, 1.8 g of benzophenone, 3.2 g of carbon black ("MA100" manufactured by Mitsubishi Chemical Corporation), and 75 g of ethyl cellosolve were added, and the mixture was well stirred to obtain colored alkali-developable photosensitive resin composition No. 4.

Example 5

Preparation of Colored Alkali-Developable Photosensitive Resin Composition No. 5

To 12 g of alkali-developable resin composition No. 5 obtained in Production Example 5, 8 g of trimethylolpropane triacrylate, 1.8 g of benzophenone, 3.2 g of carbon black ("MA100" manufactured by Mitsubishi Chemical Corporation), and 75 g of ethyl cellosolve were added, and the mixture was well stirred to obtain colored alkali-developable photosensitive resin composition No. 5.

Comparative Example 1

Preparation of Colored Alkali-Developable Photosensitive Resin Composition No. 6

To 12 g of alkali-developable resin composition No. 6 obtained in Comparative Production Example 1, 8 g of trimethylolpropane triacrylate, 1.8 g of benzophenone, 3.2 g of carbon black ("MA100" manufactured by Mitsubishi Chemical Corporation), and 75 g of ethyl cellosolve were added, and the mixture was well stirred to obtain colored alkali-developable photosensitive resin composition No. 6.

Comparative Example 2

Preparation of Colored Alkali-Developable Photosensitive Resin Composition No. 7

To 12 g of alkali-developable resin composition No. 7 obtained in Comparative Production Example 2, 8 g of trimethylolpropane triacrylate, 1.8 g of benzophenone, 3.2 g of carbon black ("MA100" manufactured by Mitsubishi Chemical Corporation), and 75 g of ethyl cellosolve were added, and the mixture was well stirred to obtain colored alkali-developable photosensitive resin composition No. 7.

Comparative Example 3

Preparation of Colored Alkali-Developable Photosensitive Resin Composition No. 8

To 12 g of alkali-developable resin composition No. 8 obtained in Comparative Production Example 3, 8 g of trimethylolpropane triacrylate, 1.8 g of benzophenone, 3.2 g of carbon black ("MA100" manufactured by Mitsubishi Chemical Corporation), and 75 g of ethyl cellosolve were added, and the mixture was well stirred to obtain colored alkali-developable photosensitive resin composition No. 8.

The evaluation of colored alkali-developable photosensitive resin compositions No. 1 to No. 8 obtained was carried out as follows.

A substrate was spin coated with (r-glycidyloxypropyl) methylethoxysilane and spin-dried well, and then the substrate was spin coated (1300 rpm, 50 seconds) with the colored alkali-developable photosensitive resin compositions and dried. After pre-baked at 70° C. for 20 minutes, the substrate was coated with a solution containing 5 wt % of polyvinyl alcohol to form an oxygen-blocking layer. After dried at 70° C. for 20 minutes, the substrate was exposed through a given mask using a super-high pressure mercury lamp as a light source. Then, the substrate was dipped to an aqueous solution containing 2.5 wt % of sodium carbonate at 25° C. for 30 seconds to develop the pattern and washed well with water. After washed with water and dried, the substrate was baked at 30° C. for 1 hour to fix the pattern. The pattern obtained was evaluated as follows. The results are shown in Table 1.

<Sensitivity>

When the sensitivity was sufficient at the exposure light amount of 100 mJ/cm$^2$ on exposure, it was rated at "a", whereas it was rated at "b" when the sensitivity was insufficient at the exposure light amount of 100 mJ/cm$^2$ and the sample was exposed at 200 mJ/cm$^2$.

<Resolution>

The sample in which a good pattern was formed with a line width of 10 μm or less was rated at "A", the sample in which a good pattern was formed in the case of a line width of 10 μm to 30 μm was rated at "B", and the sample in which a good pattern was formed only with a line width of 30 μm or more was rated at "C".

<Adhesiveness>

According to the testing method of JIS D0202, tessellated crosscut was formed on the coated film, and then peeling test was performed using a cellophane-tape to evaluate the degree of peeling of the crosscut by visual inspection. The sample in which no peeling was observed was rated at "Good", whereas the sample in which peeling was observed was rated at "Poor".

<Alkali Resistance>

The coated film after heating treatment was immersed under conditions of a) in 5 wt % NaOH aq. for 24 hours, b) in 4 wt % KOH aq. at 50° C. for 10 minutes, and c) in 1 wt % NaOH aq. at 80° C. for 5 minutes, and the appearance after immersion was evaluated by visual inspection. The sample was rated at "Good", if no change in appearance was observed and the resist was not peeled at all under any of the conditions. The sample was rated at "Poor" if lifting or peeling of the resist was observed under any of the conditions.

TABLE 1

| Alkali-developable photosensitive resin composition | Sensitivity | Resolution | Adhesiveness | Alkali resistance |
| --- | --- | --- | --- | --- |
| No. 1 (Example 1) | a | A | Good | Good |
| No. 2 (Example 2) | a | A | Good | Good |
| No. 3 (Example 3) | a | A | Good | Good |
| No. 4 (Example 4) | a | A | Good | Good |
| No. 5 (Example 5) | a | A | Good | Good |
| No. 6 (Comparative Example 1) | b | C | Poor | Poor |
| No. 7 (Comparative Example 2) | b | C | Poor | Poor |
| No. 8 (Comparative Example 3) | b | C | Poor | Poor |

The colored alkali-developable photosensitive resin compositions in Examples 1 to 5 had high sensitivity and excellent resolution. Further, the coated films obtained were excellent in adhesiveness to the substrate and alkali resistance.

On the other hand, with the colored alkali-developable photosensitive resin compositions in Comparative Examples 1 to 3, the higher amount of exposure light was required because of lower sensitivity, and the resolution was lowered so that a pattern was formed only when the line width was 30 μm or more. In addition, the adhesiveness to the substrate of the coated films obtained and the alkali resistance were also poor.

INDUSTRIAL APPLICABILITY

The colored alkali-developable photosensitive resin composition of the present invention is excellent in sensitivity, resolution, transparency, adhesiveness, alkali resistance, and the like, and capable of forming micro

What is claimed is:

1. A colored alkali-developable photosensitive resin composition comprising an alkali-developable resin composition that contains a reaction product obtained by esterification of an epoxy-adduct with a polybasic acid anhydride (C) and then with a polyfunctional epoxy compound (D), wherein the epoxy-adduct has a structure in which an unsaturated monobasic acid (B) is added to an epoxy resin (A) represented by general formula (I) below, a coloring material (E) and a photopolymerization initiator (F):

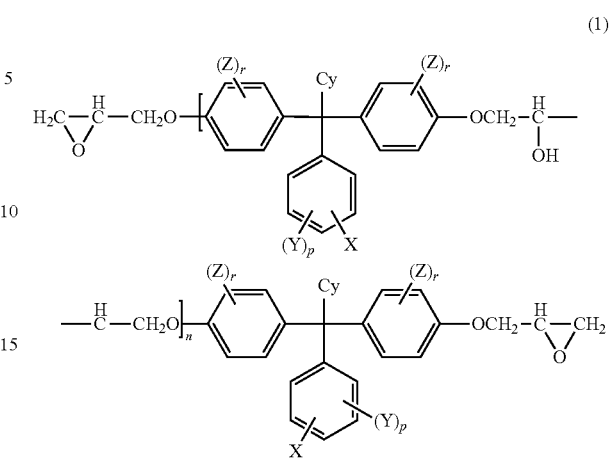

wherein Cy represents a cycloalkyl group having 3 to 10 carbon atoms; X represents a hydrogen atom, a phenyl group, or a cycloalkyl group having 3 to 10 carbon atoms; the phenyl group or the cycloalkyl group having 3 to 10 carbon atoms is optionally substituted with an alkyl group having 1 to 10 carbon atoms, an alkoxy group having 1 to 10 carbon atoms, or a halogen atom; each of Y and Z independently represents an alkyl group having 1 to 10 carbon atoms, an alkoxy group having 1 to 10 carbon atoms, an alkenyl group having 2 to 10 carbon atoms, or a halogen atom, wherein the alkyl group, the alkoxy group, and the alkenyl group are optionally substituted with a halogen atom; n represents a number of 0 to 10; p represents a number of 0 to 4; and r represents a number of 0 to 4.

2. The colored alkali-developable photosensitive resin composition according to claim 1, wherein the epoxy adduct has a structure in which 0.1 to 1.0 of the carboxyl group in the unsaturated monobasic acid (B) is added to one epoxy group in the epoxy resin (A), and the esterification is performed in such ratios that the number of the acid anhydride moiety in the polybasic acid anhydride (C) per hydroxyl group in the epoxy adduct is 0.1 to 1.0 and that the number of the epoxy group in the polyfunctional epoxy compound (D) per hydroxyl group in the epoxy adduct is 0.1 to 1.0.

3. The colored alkali-developable photosensitive resin composition according to claim 2, wherein Cy is a cyclohexyl group, X is a phenyl group, and p and r are 0 in general formula (I) above.

4. A color filter comprising at least a light-transmitting base material and a color filter layer composed of a pixel pattern with a plurality of colors, wherein at least one color in the pixel pattern with the plurality of colors is a cured article of the colored alkali-developable photosensitive resin composition according to claim 2.

5. A color filter comprising at least a transparent base material and a color filter layer composed of a pixel pattern with a plurality of colors and a black matrix, wherein said black matrix is a cured article of the colored alkali-developable photosensitive resin composition according claim 2.

6. The colored alkali-developable photosensitive resin composition according to claim 1, wherein Cy is a cyclohexyl group, X is a phenyl group, and p and r are 0 in general formula (I) above.

7. A color filter comprising at least a light-transmitting base material and a color filter layer composed of a pixel pattern with a plurality of colors, wherein at least one color in the pixel pattern with the plurality of colors is a cured article of the colored alkali-developable photosensitive resin composition according to claim 6.

8. A color filter comprising at least a transparent base material and a color filter layer composed of a pixel pattern with a plurality of colors and a black matrix, wherein said black matrix is a cured article of the colored alkali-developable photosensitive resin composition according claim 6.

9. A color filter comprising at least a light-transmitting base material and a color filter layer composed of a pixel pattern with a plurality of colors, wherein at least one color in the pixel pattern with the plurality of colors is a cured article of the colored alkali-developable photosensitive resin composition according to claim 1.

10. A color filter comprising at least a transparent base material and a color filter layer composed of a pixel pattern with a plurality of colors and a black matrix, wherein said black matrix is a cured article of the colored alkali-developable photosensitive resin composition according claim 1.

* * * * *